United States Patent
Fujii et al.

(10) Patent No.: US 11,239,824 B2
(45) Date of Patent: Feb. 1, 2022

(54) TUNING FORK-TYPE VIBRATOR

(71) Applicant: DAISHINKU CORPORATION, Kakogawa (JP)

(72) Inventors: Tomo Fujii, Kakogawa (JP); Hiroaki Yamashita, Kakogawa (JP)

(73) Assignee: Daishinku Corporation, Hyogo (JP)

( * ) Notice: Subject to any disclaimer, the term of this patent is extended or adjusted under 35 U.S.C. 154(b) by 272 days.

(21) Appl. No.: 16/473,409

(22) PCT Filed: Dec. 19, 2017

(86) PCT No.: PCT/JP2017/045510
§ 371 (c)(1),
(2) Date: Jun. 25, 2019

(87) PCT Pub. No.: WO2018/142789
PCT Pub. Date: Aug. 9, 2018

(65) Prior Publication Data
US 2020/0144988 A1 May 7, 2020

(30) Foreign Application Priority Data
Jan. 31, 2017 (JP) .............................. JP2017-015344

(51) Int. Cl.
*H03H 9/21* (2006.01)
*H03H 9/10* (2006.01)
*H03H 9/13* (2006.01)

(52) U.S. Cl.
CPC ................ *H03H 9/21* (2013.01); *H03H 9/10* (2013.01); *H03H 9/13* (2013.01)

(58) Field of Classification Search
CPC .. H03H 9/10; H03H 9/13; H03H 9/21; H03H 9/215; H03H 9/1021
See application file for complete search history.

(56) References Cited

U.S. PATENT DOCUMENTS

2008/0106172 A1* 5/2008 Tanaya ................ H03H 9/1035
310/344
2016/0260887 A1 9/2016 Fujii et al.

FOREIGN PATENT DOCUMENTS

| JP | S51-075128 A | 6/1976 |
| JP | 2003-060470 A | 2/2003 |
| JP | 2007-228431 A | 9/2007 |
| JP | 2012-044235 A | 3/2012 |
| JP | 2012-169890 A | 9/2012 |
| JP | 2015-103927 A | 6/2015 |

* cited by examiner

Primary Examiner — Jeffrey M Shin
(74) Attorney, Agent, or Firm — Norris McLaughlin, P.A.

(57) ABSTRACT

A tuning fork-type vibration piece is provided, in which a cushioning portion is formed on the base of a package to make contact with abutting portions of arm portions which are any parts but their edges, and the abutting portions of the arm portions allowed to contact the cushioning portion are electrodeless regions including no electrode, which prevents the risk of frequency fluctuations that may occur in case an electrode is chipped off by possible contact with the cushioning portion.

7 Claims, 8 Drawing Sheets

TUNING FORK-TYPE VIBRATOR

TECHNICAL FIELD

The present invention relates to a tuning fork-type vibrator which is typically used, as clock source, in electronic devices.

BACKGROUND ART

The tuning fork-type vibrator is embedded, typically as clock source and together with an oscillator circuit, in a wide range of electronic devices including watches.

The tuning fork-type vibrator includes a package, and a tuning fork-type vibration piece supported in the package in a cantilever fashion. The tuning fork-type vibrator, if subjected to any impact from outside, may warp in its thickness direction, and such warp may cause edges of arm portions of the vibration piece to contact the bottom surface of the package. Then, shock generated at the time of contact may damage or break the edges of arm portions. In the tuning fork-type vibration piece, these edges of arm portions, if thus damaged or broken, may be most likely to undergo frequency fluctuations.

Patent document 1 addresses this issue by providing a cushioning portion, like a pillow, on the bottom surface of the package. The tuning fork-type vibration piece described in this document is so structured that intermediate parts of arm portions, which are located at positions leading to their edges, are allowed to contact the cushioning portion in case the vibration piece is warped under any impact. This may avoid any contact of the edges of arm portions with the bottom surface of the package and possible damage to or breakage of the edges.

CITATION LIST

Patent Documents

Patent Literature 1; Japanese Patent No. 5175128

SUMMARY OF THE INVENTION

Technical Problems

Advancing miniaturization of electronic devices in recent years is demanding smaller and thinner tuning fork-type vibrators having outer dimensions of, for example, 1.2 mm×1.0 mm or less in plan view and thicknesses of 0.35 mm or less.

Frequency fluctuations due to external impact may be even more likely to occur in such smaller and thinner tuning fork-type vibrators, which may be unpreventable with an additional means, like the cushioning portion formed on the bottom surface of the package described earlier.

The present invention was accomplished to address the issue of the known art, and is directed to providing a tuning fork-type vibrator that may excel in shock resistance and accordingly suppress the risk of frequency fluctuations.

Solutions to Problem

The inventors of the present invention conducted thorough studies and various experiments in search of solutions to suppress the risk of frequency fluctuations, which led to the following fact; electrodes formed at the edges of arm portions along their circumferences, if affected by any external impact, may possibly be forced into contact with the cushioning portion formed on the package's bottom surface, which is likely to chip off the electrodes and result in frequency fluctuations. Based on this finding, the inventors accomplished the present invention.

A tuning fork-type vibrator according to an aspect of the present invention includes: a tuning fork-type vibration piece having a stem portion and a plurality of arm portions extending from the stem portion; and a package including a housing portion in which the tuning fork-type vibration piece is housed. The stem portion is joined to an electrode in the housing portion of the package. The housing portion of the package has a cushioning portion formed in a certain thickness on a bottom surface thereof. The cushioning portion is in contact with abutting portions which are a portion but the edges of the plurality of arm portions when the plurality of arm portions are bent toward the bottom surface, whereby the edges are prevented from contacting the bottom surface. The plurality of arm portions are the free ends of the tuning fork-type vibrating piece The abutting portions are electrodeless regions where the tuning fork-type vibration piece has a raw surface thereof exposed in the absence of any electrode.

The electrodeless regions may include at least the abutting portions of the plurality of arm portions and extend as far as the edges of the plurality of arm portions.

According to the present invention, in case the tuning fork-type vibration piece is warped in its thickness direction under impact from outside, the abutting portions of the arm portions, which are located at intermediate positions leading to their edges, may contact the cushioning portion formed on the bottom surface of the package. This may avoid contact of the edges of the free end-side arm portions with the bottom surface of the package, consequently preventing possible damage to or breakage the edges of the arm portions that are most likely to undergo frequency fluctuations if damaged or broken by such an impact.

Since the abutting portions that serve to contact the cushioning portion formed on the bottom surface of the package are electrodeless regions, there is no electrode damageable or breakable even if the electrodeless regions are forced into contact with the cushioning portion due to impact from outside. This may suppress the risk of frequency fluctuations under any external impact.

A tuning fork-type vibrator according to another aspect of the present invention includes: a tuning fork-type vibration piece having a stem portion and a plurality of arm portions extending from the stem portion; and a package including a housing portion in which the tuning fork-type vibration piece is housed. The stem portion is joined to an electrode in the housing portion of the package. The housing portion of the package has a cushioning portion formed in a certain thickness on a bottom surface thereof. The cushioning portion is formed to avoid possible contact of edges of the plurality of arm portions with the bottom surface by allowing abutting portions of the plurality of arm portions to contact the cushioning portion in case the plurality of arm portions on a free end side of the tuning fork-type vibration piece are warped toward the bottom surface. The abutting portions are any parts but the edges of plurality of arm portions. The abutting portions each include a shock absorber that absorbs shock at the time of contact with the cushioning portion.

In case the tuning fork-type vibration piece is warped in its thickness direction under impact from outside, the abutting portions of the arm portions, which are located at intermediate positions leading to their edges, may contact the cushioning portion formed on the bottom surface of the package. This may avoid any contact of the edges of the free end-side arm portions with the bottom surface of the package, consequently preventing possible damage to or breakage the edges of the arm portions that are most likely to undergo frequency fluctuations if damaged or broken by such an impact.

Further advantageously, the abutting portions of the arm portions each have a shock absorber that receives shock generated at the time of contact with the cushioning portion formed on the bottom surface of the package. This may prevent the risk of breakage of or damage to the electrode. This may suppress the risk of frequency fluctuations under any external impact.

According to yet another aspect of the present invention, the shock absorber may preferably include a metal film, and the metal film may preferably have a thickness greater than or equal to 1 μm.

The shock absorber thus including a metal film of 1 μm in thickness may fully absorb any impact caused by the contact with the cushioning portion.

According yet another aspect of the present invention, the stem portion may preferably include a metal bump. The metal bump is formed to join the tuning fork-type vibration piece to the electrode in the housing portion of the package and includes a material used to form the metal film.

According to this aspect, the metal film and the metal bump may be formed together in a single step.

According to yet another aspect of the present invention, preferably, a frequency adjustment metal film may be formed in an edge-side region on one of front and back main surfaces in a respective one of the plurality of arm portions, and the abutting portion may be formed on the other one of the front and back main surfaces in a respective one of the plurality of arm portions.

According to yet another aspect of the present invention, the edge-side regions of the plurality of arm portions provided with the frequency adjustment metal films may preferably be greater in width than any other regions of the plurality of arm portions.

The regions of the frequency adjustment metal films thus increased in the direction of width of the arm portions may allow a greater extent of frequency adjustment even with microminiaturized tuning fork-type vibration pieces.

According yet another aspect of the present invention, in the tuning fork-type vibration piece supported in the package in a cantilever fashion, the cushioning portion may preferably formed on the bottom surface so as to extend in a direction orthogonal to a direction of extension of the plurality of arm portions correspondingly to the tip-side regions increased in width of the plurality of arm portions.

When the tuning fork-type vibration piece is mounted in the package, with its stem portion being joined to the electrode in the housing portion, mounting precision may possibly be variable in the direction of width of the stem portion. Such variability in mounting precision may be resolved by allowing the tuning fork-type vibration piece to contact the cushioning portion formed correspondingly to the widened regions of the arm portions in case the vibration piece is warped during the mounting process.

Effects of the Invention

In case the tuning fork-type vibrator is subject to any impact from outside, the tuning fork-type vibration piece may be thereby warped in its thickness direction. At the time, the abutting portions of the arm portions, which are located at positions leading to their edges, are allowed to contact the cushioning portion formed on the bottom surface of the package, which may avoid possible contact between the package's bottom surface and the edges of the free end-side arm portions. This may prevent breakage of or damage to the edges of the arm portions that are most likely to undergo frequency fluctuations if damaged or broken by such an impact.

The abutting portions that serve to contact the cushioning portion formed on the bottom surface of the package are electrodeless regions or the abutting portions are provided with shock absorbers that absorb any impact-caused. The electrode, therefore, may be unlikely to chip off at the time of contact with the cushioning portion. Thus, the tuning fork-type vibrator provided by the present invention may excel in shock resistance and accordingly suppress the risk of frequency fluctuations under any impact from outside.

EMBODIMENTS OF THE INVENTION

Embodiments of the present invention are hereinafter described in detail referring to the accompanying drawings.

First Embodiment

Figure 1:
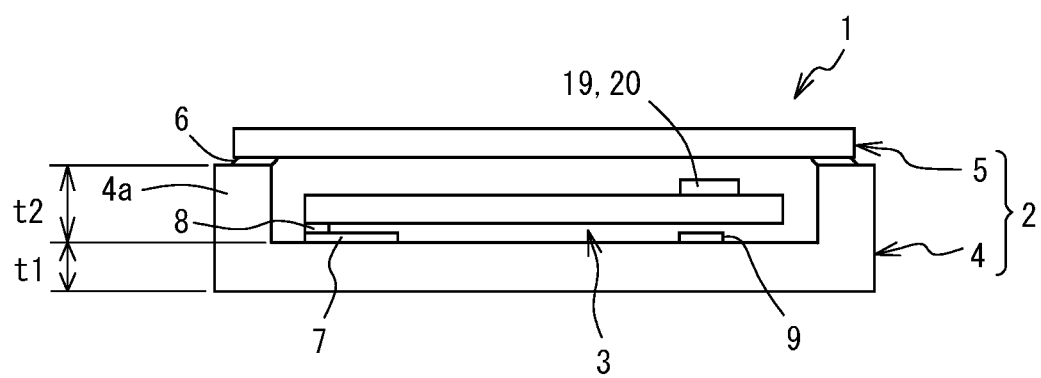
FIG. 1 is a schematic view in cross section of a tuning fork-type crystal vibrator according to an embodiment of the present invention.
Figure 2:
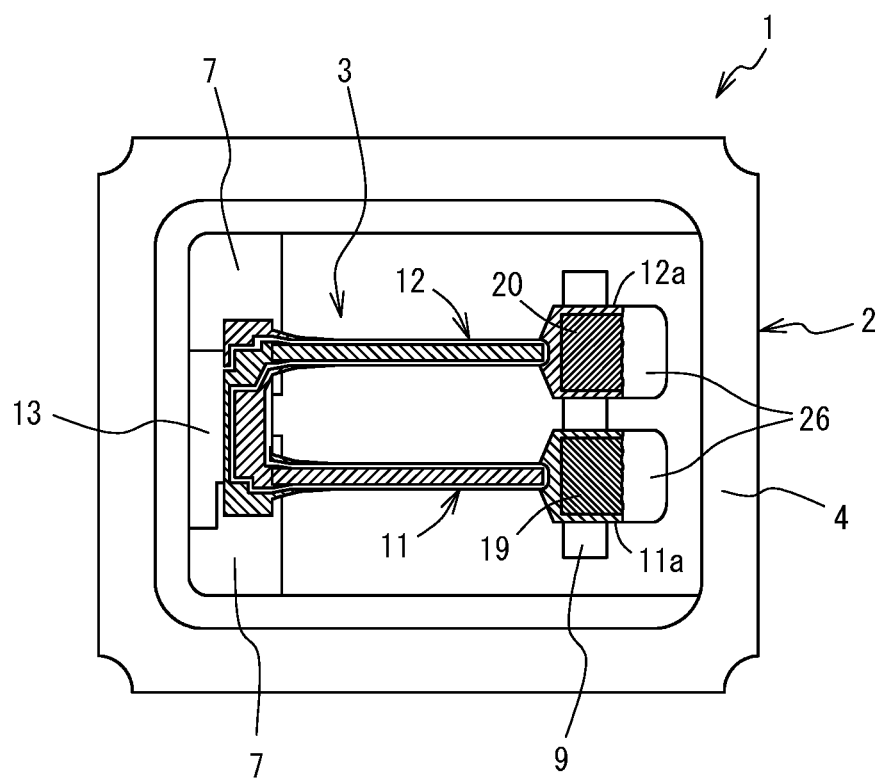
FIG. 2 is a plan view of the crystal vibrator illustrated in FIG. 1 from which a lid member has been detached.
Figure 3:
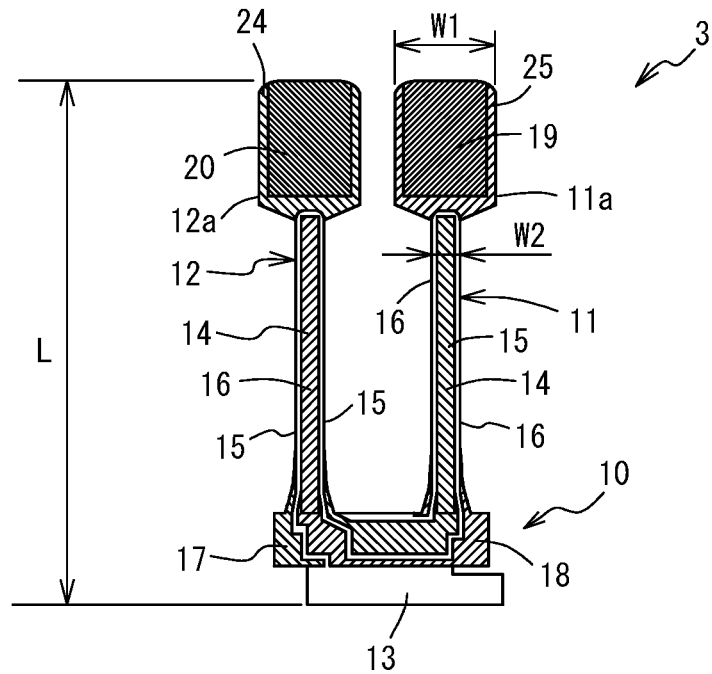
FIG. 3 is a drawing of a main-surface side of a tuning fork-type crystal vibration piece.
Figure 4:
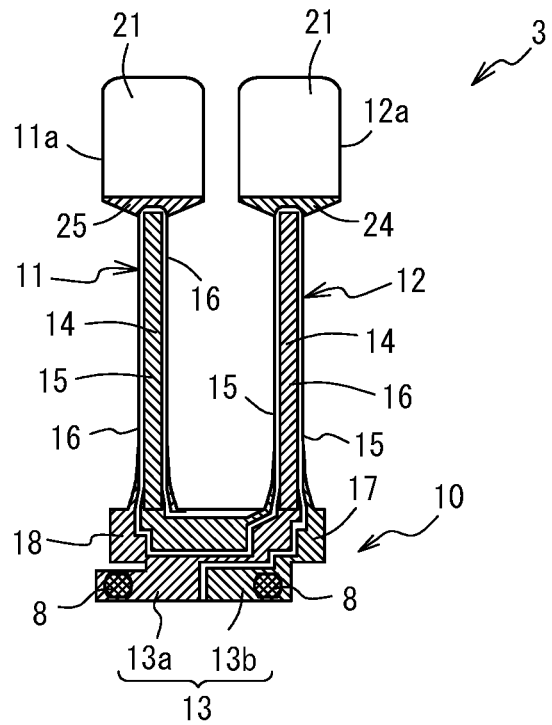
FIG. 4 is a drawing of another main-surface side of the crystal vibration piece.

FIG. 1 is a schematic view in cross section of a tuning fork-type crystal vibrator 1 according to an embodiment of the present invention. FIG. 2 is a plan view of the crystal vibrator illustrated in FIG. 1 from which a lid member 5 has been detached. FIG. 3 is a drawing of a main-surface side of a tuning fork-type crystal vibration piece 3. FIG. 4 is a drawing of another main-surface side of the crystal vibration piece 3. FIG. 3 illustrates the crystal vibration piece 3 before frequency adjustment metal films 19 and 20 formed thereon are irradiated with a laser beam and thereby partly removed. FIG. 2 illustrates the crystal vibration piece 3 in which the raw surface of crystal 26 is exposed after the laser-used removal in part of the frequency adjustment metal films 19 and 20.

In the tuning fork-type crystal vibrator 1 according to this embodiment, the tuning fork-type crystal vibration piece 3 is housed in a package 2 made of, for example, a ceramic material. The package 2 includes a base 4; package body, and a lid member 5. The base 4 and the lid member 5 are joined to each other with a sealing member 6. Specifically, the tuning fork-type crystal vibration piece 3 is joined, with a pair of metal bumps 8; joining material, to a pair of electrode pads 7 on the base 4 having an opening on its upper side, and the plate-shaped lid member 5 is joined to the base 4 so as to close the opening. The joining material is not necessarily limited to the metal bumps 8 and may be selected from other materials, for example, conductive resin adhesives and brazing filler materials.

While the nominal frequency of this tuning fork-type crystal vibrator 1 according to this embodiment is 32.768 kHz, other frequencies may be applicable instead of the nominal frequency.

The base 4 of the package 2 is a container having insulating properties which is made of, for example, a ceramic or glass material. In this embodiment, the material of the base 4 is a ceramic material, and the base 4 is formed by firing. The base 4 has an opening on its upper side, and its inside has a recessed shape surrounded by a peripheral wall 4a a. The recessed inside of the base 4 is a housing portion for the tuning fork-type crystal vibration piece 3. On the inside of the base 4, the paired electrode pads 7 are formed on the bottom surface at positions on one end side in the longitudinal direction of the base 4 (lateral direction on FIGS. 1 and 2). The electrode pads 7 are electrically connected to terminal electrodes, not illustrated in the drawings, on the back surface of the base 4 through a wiring pattern (not illustrated in the drawing). At a position on the bottom surface of the base 4 on its longitudinally other end side, a cushioning portion 9, like a pillow, is formed so as to extend in a direction orthogonal to the longitudinal direction of the base 4 (vertical direction on FIG. 2). The tuning fork-type crystal vibration piece 3 is supported in the package in a cantilever fashion, and this structure possibly causes the crystal vibration piece 3 to warp toward the bottom surface of the base 4 under any impact from outside. When such an event occurs, the cushioning portion 9 serves to prevent possible damage to or breakage of edges of the crystal vibration piece 3 on its free end side by avoiding direct contact between the edges and the bottom surface of the base 4.

The lid member 5 is a solid plate rectangular in plan view and made of, for example, a metal, ceramic, or glass material. In this embodiment, a metal material is used to form the lid member 5.

The tuning fork-type crystal vibrator 1 according to this embodiment is a microminiaturized and very thin vibrator in which the package 2 rectangular in plan view have outer dimensions of, for example, 1.2 mm×1.0 mm, and a thickness (height) of, for example, 0.35 mm, inclusive of the lid member 5.

The size of the package 2 of the crystal vibrator 1 according to the present invention is not necessarily limited to the before-mentioned dimensions. This package may be formed in a rectangular shape in plan view having outer dimensions of, for example, 2.0 mm×1.6 or 1.6 mm×1.0 mm, and a height of, for example, 0.45 mm, inclusive of the lid member 5.

In this embodiment, the base 4 has a thickness t1 of, for example, 0.09 mm at its bottom illustrated in FIG. 1, and the peripheral wall 4a of the base 4 has a thickness (height) t2 of, for example, 0.15 mm. The tuning fork-type crystal vibration piece 3 of approximately 0.08 mm in thickness is housed in the recessed housing portion inside of the base 4. In the package 2, therefore, there are clearances of, for example, approximately 0.035 mm above and below the crystal vibration piece 3.

Multiple tuning fork-type crystal vibration pieces 3 are obtained from a sheet of crystal wafer not illustrated in the drawing. The outer shapes of these crystal vibration pieces 3 are collectively formed at once on the crystal wafer by photolithography, specifically by, for example, wet etching using a resist or metal film as mask As illustrated in FIGS. 3 and 4, the crystal vibration piece 3 includes a stem portion 10, and a pair of first and second arm portions 11 and 12; vibrating members; extending in parallel from one end side of the stem portion 10. The stem portion 10 includes a joining portion 13 joined to the base 4. The joining portion 13 of this embodiment is formed so as to extend in a direction opposite to a direction of extension of the first and second arm portions 11 and 12 and further extend in one of directions orthogonal to the arm portion-extending direction (rightward on FIG. 3).

The first and second arm portions 11 and 12 respectively have tip-side parts 11a and 12a. The tip-side parts 11a and 12a are greater in width than the other parts of these arm portions in a direction orthogonal to the arm portion-extending direction, i.e., in a direction of width of the first, second arm portion 11, 12 (lateral direction on FIGS. 3 and 4). Referring to FIG. 3, "W1" indicates the width. The cushioning portion on the bottom surface of the base 4 is formed in a certain thickness so as to face the regions each having the width W1 of the tip-side parts 11a and 12a of the first and second arm portions 11 and 12. The height, i.e., thickness, of the cushioning portion 9 may be, for example, 0.01 mm.

Further, the first and second arm portions 11 and 12 respectively have grooves 14 on their main surfaces illustrated in FIGS. 3 and 4. The grooves 14 are formed along the arm portion-extending direction.

The tuning fork-type crystal vibration piece 3 includes two first driving electrodes 15 and second driving electrodes 16, and extraction electrodes 17 and 18 that are respectively extracted from the driving electrodes 15 and 16 to electrically connect these driving electrodes to the electrode pads 7 of the base 4. The first and second driving electrodes 15 and 16 are partly formed in the grooves 14 of the two main surfaces.

The first driving electrodes 15 are respectively formed on both main surfaces of the first arm portion 11 inclusive of the grooves 14 and on both side surfaces of the second arm portion 12. The first driving electrodes 15 are connected to the extraction electrode 17. Similarly, the second driving electrodes 16 are respectively formed on both main surfaces of the second arm portion 12 inclusive of the grooves 14 and on both side surfaces of the first arm portion 11, and the second driving electrodes 16 are connected to the extraction electrode 18.

In the first and second arm portions 11 and 12 illustrated in FIG. 3, tip-of-arm electrodes 25 and 24 are respectively formed in regions of the tip-side parts 11a and 12a increased in width. The tip-of-arm electrode 25 formed on the tip-side part 11a is connected to the second driving electrodes 16 formed on the side surfaces of the first arm portion 11. The tip-of-arm electrode 24 formed on the tip-side part 12a is connected to the first driving electrodes 15 formed on the side surfaces of the second arm portion 12.

In this embodiment, as described later, the tip-of-arm electrodes 24 and 25 are not formed in the widened regions of the tip-side parts 11a and 12a of the first and second arm portions 11 and 12, except their parts closer to the stem portion 10, on the main-surface side facing the bottom surface of the base 4, as illustrated in FIG. 4. These regions are electrodeless regions 21 where the crystal raw surface is exposed in the absence of any tip-of-arm electrodes, which are provided to suppress the risk of frequency fluctuations possibly caused by any impact from outside.

Frequency adjustment metal films 19 and 20 are formed on the tip-of-arm electrodes 25 and 24 of the tip-side parts 11a and 12a on one main-surface side illustrated in FIG. 3. The frequency adjustment metal film 19, 20 is formed in a slightly smaller area than the tip-of-arm electrode 25, 24 and is irradiated with, for ample, a laser beam and thereby reduced in mass for coarse frequency adjustment of the crystal vibration piece 3. The frequency adjustment metal films 19 and 20 are formed as far as edges of the arm portions 11 and 12, i.e., edges of the widened tip-side parts 11a and 12a.

The first and second driving electrodes 15 and 16, extraction electrodes 17 and 18, and tip-of-arm electrodes 24 and 25 of the crystal vibration piece 3 are thin films in which a metal, for example, gold, is deposited on chromium layers formed by metallization on the arm portions 11 and 12. Such a thin film is formed on the whole surface of a base material by, for example, vacuum deposition or sputtering and then shaped into a desired form by metal etching using photolithography. The metals used in the first and second driving electrodes 15 and 16, extraction electrodes 17 and 18, and tip-of-arm electrodes 24 and 25 are not necessarily limited to the combination of chromium and gold, and may instead be the combination of chromium and silver.

The frequency adjustment metal films 19 and 20 are formed on the tip-side parts 11a and 12a of the arm portions 11 and 12 by, for example, plating such as electrolytic plating. The frequency adjustment metal films 19 and 20 may preferably be formed in the process of forming the metal bumps 8 described later. In this embodiment, gold (Au) is used to form these metal films 19 and 20.

Two metal bumps 8 made of, for example, gold are formed in the joining portion 13 on the other main-surface side illustrated in FIG. 4 to be joined to the electrode pads 7 of the base 4. One of the metal bumps 8 is formed on the extraction electrode 17 which is extracted from the first driving electrode 15 so as to extend as far as a first joining portion 13b, while the other one of the metal bumps 8 is formed on the extraction electrode 18 which is extracted from the second driving electrode 16 so as to extend as far as a second joining portion 13a. The joining portion 13, which constitutes the stem portion 10 in part, is joined to the electrode pads 7 of the base 4 and accordingly serves to support the crystal vibration piece 3. The metal bump 8 described herein has an oval shape in plan view, however, may be shaped otherwise. The shape of the metal bump 8 may be circular or polygonal, for example, rectangular or square. The metal bumps 8 are formed by plating, for example, electrolytic plating.

In the first, second arm portion 11, 12, the width W1 of the tip-side part 11a, 12a provided with the frequency adjustment metal film 19, 20 is greater than the width 2 of any other portions, as described earlier. In this embodiment, the width W1 of the tip-side part 11a, 12a may be, for example, threefold greater than the width W2.

In the first and second arm portions 11 and 12, the tip-side parts 11a and 12a provided with the frequency adjustment metal films 19 and 20 are thus formed in a greater width because of the following reason.

In the tuning fork-type crystal vibration piece, its frequency is inversely proportional to the square of the length of the arm portion and is proportional to the width of the arm portion. To further miniaturize the tuning fork-type crystal vibration piece, reduction of the arm portions in length is desirable, which, however, leads to a higher frequency. To prevent that, the metal film; weight member for frequency adjustment, needs to be formed in a greater area on the tip-side part of the arm portion. Another possible approach to prevent frequency increases to higher frequencies may be reduction of the arm portions in width, which, however, may result in poor values of CI (crystal impedance).

As described earlier, the frequency adjustment metal films are formed on the tip-side parts and serve as weight members in the tuning fork-type crystal vibration piece supported in the package in a cantilever fashion. When the arm portions are desirably reduced in length to further miniaturize the crystal vibration piece without degrading the CI value, therefore, the tip-side parts should be increased in width.

As the tip-side parts of the arm portions are thus larger, the tuning fork-type crystal vibration piece is more likely to warp under any impact from outside.

Further, an attempt to reduce the crystal vibration piece in thickness leads to smaller clearances above and below the crystal vibration piece in the package.

In the thin, miniaturized tuning fork-type crystal vibration pieces of the known art, a cushioning portion is formed in a certain thickness on the bottom surface of the base, so that intermediate abutting portions of the arm portions, which are located at positions leading to their free-end edges, contact the cushioning portion in case the crystal vibration piece supported in the package in a cantilever fashion is warped under impact from outside. This may prevent possible contact between the bottom surface of the base and edges of these vibrating arms that are most likely to undergo frequency fluctuations when damaged or broken by the contact. Yet, the anti-shock test performed on such crystal vibration pieces detected frequency increases to higher frequencies in some of the vibration pieces. Thus, there is still room for improvement of shock resistance.

The inventors of the present invention opened the packages of the tuning fork-type crystal vibration pieces that resulted in frequency increases to higher frequencies in the anti-shock test and removed the crystal vibration pieces from the packages. The inventors who observed the crystal vibration pieces confirmed some chipped-off parts in the tip-of-arm electrodes at edges of the arm portions that contacted the cushioning portions when these crystal vibration pieces were possibly warped.

This embodiment provides the electrodeless regions 21 on the main-surface side facing the bottom surface of the base 4, specifically, the tip-of-arm electrodes 24 and 25 are unformed in the widened regions, except their parts closer to the stem portion 10, of the tip-side parts 11a and 12a of the first and second arm portions 11 and 12, as illustrated in FIG. 4.

As described earlier, the frequency adjustment metal films 19 and 20 formed on the one main-surface side of the tuning fork-type crystal vibration piece 3 are irradiated with a beam, for example, a laser beam and thereby partly removed for coarse frequency adjustment.

Figure 5:
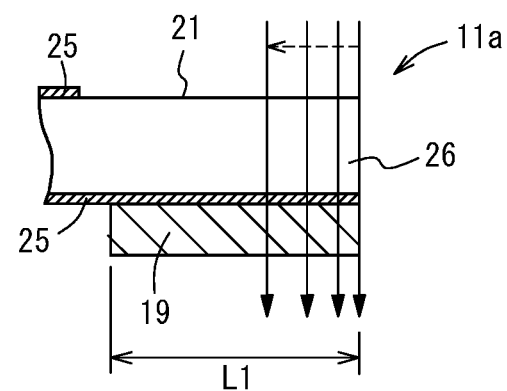
FIG. 5 is a drawing that illustrates coarse frequency adjustment of the crystal vibration piece through laser beam irradiation.

FIG. 5 is a drawing that illustrates coarse frequency adjustment through the laser beam irradiation. While FIG. 5 illustrates the frequency adjustment metal film 19 formed on the tip-side part 11a of the first arm portion 11 alone, the laser beam irradiation is applied likewise to the frequency adjustment metal film 20 formed on the tip-side part 12a of the second arm portion 12.

A laser beam source (not illustrated in the drawings) is positioned so as to face one main-surface side of each of the crystal vibration pieces 3 on the crystal wafer. The laser beam is then radiated from the source so as to remove the frequency adjustment metal film 19 on the other main-surface side.

This laser beam irradiation starts at the tip-side part (right side in FIG. 5) where the mass reduction induces a highest level of frequency fluctuation, advancing along the width direction of the first arm portion 11 (direction perpendicular to the drawing of FIG. 5) at positions shifted by degrees toward the stem portion 10 of the first arm portion 11 (left side on FIG. 5).

The radiated laser beam enters one main-surface side of each of the crystal vibration pieces 3 on the crystal wafer and transmits through crystal 26 inside of the crystal vibration piece 3, and then arrives at the frequency adjustment metal film 19 formed on the opposite main-surface side, consequently removing the tip-of-arm electrode 25 and the frequency adjustment metal film 19 on the respective main surfaces.

The frequency adjustment metal film 19 is removed by thus irradiating this film with the laser beam directed from the upper side and transmitting through the crystal 26 inside of the crystal vibration piece 3. At the time, any metal fragments chipped off the frequency adjustment metal film 19 may fly downward away from this metal film. This may prevent the metal fragments from adhering again to the crystal vibration piece 3. The laser beam may be directed so as to transmit through the crystal from the lower to upper side of the crystal vibration piece 3. The laser used in this embodiment is a green laser, however, may be selected from other lasers having different wavelengths, including YAG laser.

The multiple tuning fork-type crystal vibration pieces 3 on the crystal wafer, subsequent to coarse frequency adjustment under the laser beam irradiation, are broken off the crystal wafer into individual pieces, which are each joined to the electrode pads 7 of the base 4 and mounted in the package 2. Then, final fine frequency adjustment is performed on the crystal vibration piece 3 joined to the electrode pads 7 of the base 4 in the package 2. The frequency adjustment metal films 19 and 20 being formed on one main-surface side alone provides two advantages; improved efficiency of frequency adjustment, and effective reduction of the amount of metal used.

Figure 6:
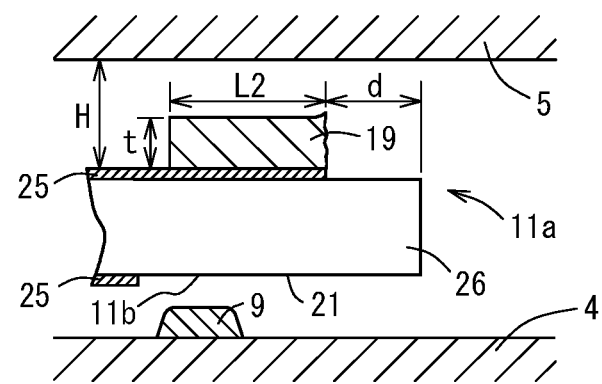
FIG. 6 is a schematic view in cross section of an edge and its vicinity of the crystal vibration piece housed in a package.

FIG. 6 is a schematic view in cross section of an edge and its vicinity of the tuning fork-type crystal vibration piece 3 housed in the package 2. While FIG. 6 illustrates the tip-side part 11a of the first arm portion 11, the same applies to the tip-side part 12a of the second arm portion 12.

In the tuning fork-type crystal vibration piece 3 housed in the package 2, the frequency adjustment metal film 19 formed on one main-surface side is facing the inner surface of the lid member 5, while the other main-surface side of the crystal vibration piece 3 is facing the bottom surface of the base 4.

In case the tuning fork-type crystal vibration piece 3 supported in the package in a cantilever fashion is warped under impact from outside toward the bottom surface of the base 4, the abutting portion 11b of the first arm portion 11, instead of its edge, contacts the cushioning portion 9 formed on the bottom surface of the base 4. This may avoid any contact of the edge of the widened tip-side part 11a of the first arm portion 11 with the bottom surface of the base 4 and accordingly prevent damage to or breakage of the edge of the tip-side part 11a possibly caused by the contact. Likewise, the abutting portion 12a of the second arm portion 12 (not illustrated in the drawing) contacts the cushioning portion 9 in case the tuning fork-type crystal vibration piece 3 is warped under impact toward the bottom surface of the base 4, which may avoid any contact of the widened tip-side part 12a of the second arm portion 12 with the bottom surface of the base 4 and accordingly prevent damage to or breakage of the tip-side part 12a possibly caused by the contact.

As illustrated in FIG. 6, the electrodeless region 21 on the other main-surface side of the tip-side part 11a of the first arm portion 11 at least includes the abutting portion 11b of the first arm portion 11 allowed to contact the cushioning portion 9 in case the tuning fork-type crystal vibration piece 3 supported in the package in a cantilever fashion is warped toward the bottom surface of the base 4 under any impact from outside, and the electrodeless region 21 is formed as far as the edge of the widened tip-side part 11a of the first arm portion 11. Similarly, the electrodeless region 21 of the tip-side part 12a of the second arm portion 12 at least includes the abutting portion 12b of the second arm portion 12 allowed to contact the cushioning portion 9 in case the tuning fork-type crystal vibration piece 3 is warped under any impact from outside, and the electrodeless region 21 is formed as far as the edge of the widened tip-side part 12a of the second arm portion 12.

Thus, the abutting portions 11b and 12b of the first and second arm portions 11 and 12, which are allowed to contact the cushioning portion 9 on the bottom surface of the base 4, are included in the electrodeless regions 21 where no tip-of-arm electrode is formed. Thus, there is no tip-of-arm electrode possibly chipped off by any contact of the abutting portions 11b and 12b with the cushioning portion 9 caused by impact from outside. This may eliminate the risk of frequency increases to higher frequencies under any impact from outside.

The electrodeless regions 21 described herein extend as far as the abutting portions 11b and 12b of the first and second arm portions 11 and 12 that possibly contact the cushioning portion 9 and also as far as edges of the tip-side parts of the first and second arm portions 11 and 12. Instead, the electrodeless regions may be limited to the abutting portions 11b and 12b alone.

As described earlier, the abutting portions 11b and 12b of the arm portions 11 and 12 are allowed to contact the cushioning portion 9 on the bottom surface of the base 4 in case the tuning fork-type crystal vibration piece 3 is warped toward the bottom surface of the base 4 under impact from outside. Thus, possible contact of edges of the arm portions 11 and 12 with the bottom surface of the base 4 may be successfully avoided, and damage to or breakage of these edges possibly caused by the contact may be accordingly prevented. This embodiment may also prevent that edges of the widened tip-side parts 11a and 12a of the arm portions 11 and 12 contact the inner surface of the lid member 5 in case the crystal vibration piece 3 is warped toward the lid member 5 and accordingly prevent damage to or breakage of the edges possibly caused by the contact.

In this embodiment, the frequency adjustment metal films 19 and 20 partly removed through the laser beam irradiation are facing the inner surface of the lid member 5 and are allowed to contact the inner surface of the lid member 5 when the arm portions 11 and 12 of the tuning fork-type crystal vibration piece 3 are warped toward the lid member 5 under impact from outside. This may prevent possible contact between the inner surface of the lid member 5 and edges of the tip-side parts 11a and 12a of the arm portions 11 and 12.

To this end, the frequency adjustment metal films 19 and 20 are increased in thickness to, for example, a thickness of 9 μm or more. In this embodiment, the frequency adjustment metal films 19 and 20 are formed by plating, as described earlier, in a thickness of, for example, approximately 10 μm.

The tuning fork-type crystal vibration piece 3 on the crystal wafer is subjected to coarse frequency adjustment through the laser beam irradiation, so that its frequency stays within a required range of frequencies. At the time, how much of the frequency adjustment metal films 19 and 20 should be removed may differ from one crystal vibration piece 3 to another. In this embodiment, after the laser-used coarse frequency adjustment, the frequency adjustment metal film 19, 20 is left unremoved in a length greater than half a length of the region where the metal film is formed along the longitudinal direction (lateral direction on FIG. 6) of the arm portion 11, 12.

The longitudinal length "L2" of the frequency adjustment metal film 19, 20 illustrated in FIG. 6 after the coarse frequency adjustment is, L2>0.5L1, where "L1" is the longitudinal length of the frequency adjustment metal film 19, 20 illustrated in FIG. 5 before the coarse frequency adjustment.

In this embodiment, therefore, when the L1 is 0.2 mm, for example, the L2 is greater than 0.1 mm.

The frequency adjustment metal film 19, 20 is removed by the laser beam irradiation in a length equal to or less than half the longitudinal length L1. This may be rephrased that the frequency adjustment metal film 19, 20 remains unremoved in a length greater than half the longitudinal length L1. When the arm portions 11 and 12 of the crystal vibration piece 3 are warped toward the lid member 5, the remaining frequency adjustment metal films 19 and 20 are allowed to contact the inner surface of the lid member 5. This may prevent possible contact of edges of the widened tip-side parts 11a and 12a of the first and second arm portions 11 and 12 with the inner surface of the lid member 5 and accordingly prevent damage to or breakage of edges of the tip-side parts 11a and 12a possibly caused by the contact.

The frequency adjustment metal film 19, 20 has a thickness "t" greater than or equal to 9 μm, which may be thick enough to alleviate any shock caused by contact of these metal films with the inner surface of the lid member 5.

The longitudinal length L2 of the frequency adjustment metal film 19, 20 after the coarse frequency adjustment is greater than, for example, 0.1 mm. Therefore, a length "d" of a removed portion of the frequency adjustment metal film 19, 20 from its edge part may be, for example, 0.1 mm or less. The length d of the laser-removed portion of the frequency adjustment metal film 19, 20 may differ from one crystal vibration piece to another, and may be d=0 in some of them.

Assuming that "L" is the length of the tuning fork-type crystal vibration piece 3 illustrated in FIG. 3, the L in this embodiment may be, for example, 0.9 mm.

The length d of the laser-removed portion of the frequency adjustment metal film 19, 20 is 0.1 mm or less. Therefore, the ratio of the length d to the length "L" of the tuning fork-type crystal vibration piece 3 is $d/L \leq 0.1/0.9 = 0.11$, i.e., $d/L \leq 0.11$.

Provided that "t" is the thickness of the frequency adjustment metal film 19, 20, and "H" is an interval between the inner surface of the lid member 5 and a part of the arm portion 11 where no frequency adjustment metal film is formed, the interval H in this embodiment may be, for example, 35 μm, and the thickness t of the frequency adjustment metal film 19, 20 may preferably be, for example, greater than or equal to 9 μm and less than or equal to 15 μm.

The ratio of the thickness t of the frequency adjustment metal film 19, 20 to the interval H, i.e., the ratio t/H, is $9/35 = 0.257$ or $15/35 = 0.429$, or preferably in the range of $0.25 \leq t/H \leq 0.43$.

The ratio of the thickness t of the frequency adjustment metal film 19, 20 to the interval H may preferably be greater than or equal to 0.25 and less than or equal to 0.43.

In case the arm portions 19 and 20 of the tuning fork-type crystal vibration piece 3 are warped toward the lid member 5 under impact from outside, the frequency adjustment metal films 19 and 20, the thickness t of which is smaller than 9 μm, may increase the likelihood that edges of the tip-side parts 11a and 12a of the arm portions 11 and 12 contact the inner surface of the lid member 5 before the remainder of these metal films can make any contact, which involves a higher risk of damage to or breakage of these edges. Further, the frequency adjustment metal films 19 and 20 may be not thick enough to absorb any shock generated at the time of contact with the inner surface of the lid member 5.

On the other hand, the frequency adjustment metal films 19 and 20, the thickness t of which is greater than 15 μm, may unnecessarily increase the chance of contact with the metal-made lid member 5 even when affected by a very small impact from outside.

The longitudinal length of the frequency adjustment metal film 19, 20 removed by the laser beam irradiation is controlled to be equal to or less than half the length of this metal film before the coarse frequency adjustment, as described below. In this embodiment, a higher first target frequency than conventionally employed first target frequencies is set for a step of forming electrodes in the stem portions and the arm portions extending from the stem portions of multiple tuning fork-type vibration pieces integrally coupled on a crystal wafer.

Figure 7:
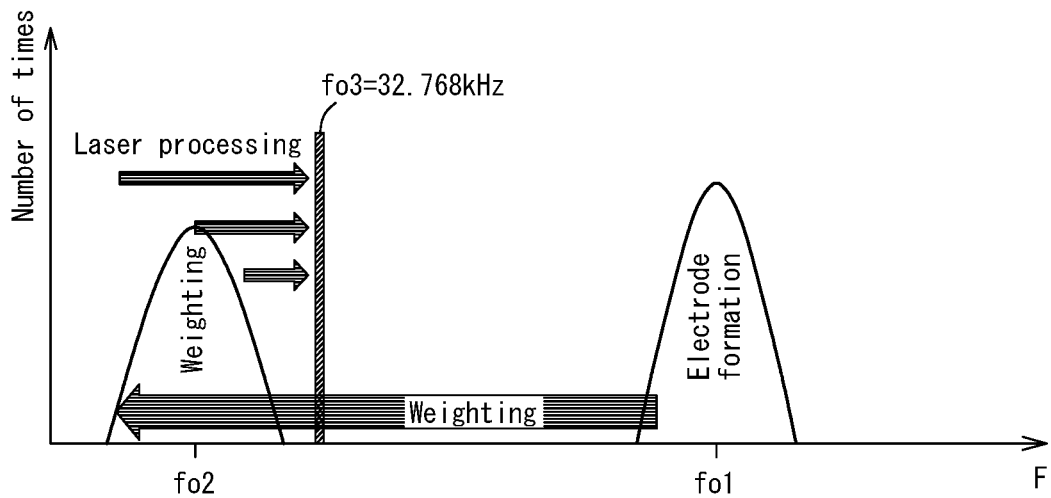
FIG. 7 is a drawing that illustrates target frequencies in an electrode forming step, a weighting step, and a laser processing step.
Figure 8:
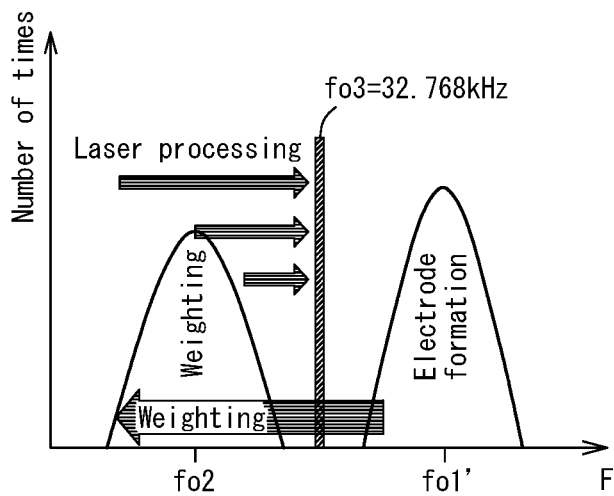
FIG. 8 is a drawing of the known art illustrated correspondingly to FIG. 7.

FIG. 7 is a drawing that illustrates target frequencies in respective steps according to this embodiment; electrode forming step, weighting step of forming the frequency adjustment metal films 19 and 20, and coarse frequency adjustment (laser processing) step using laser beam irradiation. FIG. 8 is a drawing of the known art illustrated correspondingly to FIG. 7. In FIGS. 7 and 8, lateral and vertical respectively represent frequency and number of times.

In this embodiment, a first target frequency fo1 illustrated in FIG. 7 is a frequency set for the electrode forming step of forming electrodes in the stem portions and in the arm portions extending from the stem portions of multiple tuning fork-type vibration pieces integrally coupled on a crystal wafer. This first target frequency fo1 is higher than a first target frequency fo1' employed in an electrode forming step of the known art illustrated in FIG. 8.

A second target frequency fo2 illustrated in FIG. 7 is a frequency set for the weighting step of forming the frequency adjustment metal films 19 and 20 on the tip-side parts 11a and 12a of the arm portions 11 and 12 of the crystal vibration piece 3. This second target frequency fo2 is equal to a second target frequency fo2 illustrated in FIG. 8 employed in a weighting step of the known art illustrated in FIG. 8.

In the weighting step of forming the frequency adjustment metal films 19 and 20 on the tip-side parts 11a and 12a, therefore, the frequency adjustment metal films 19 and 20 are formed in a greater amount than in the known art (larger weighting amount).

A third target frequency fo3 set for the coarse frequency adjustment step using laser beam irradiation, which follows the weighting step, is the nominal frequency 32.768 kHz. This frequency is equal to a third target frequency fo2 employed in a coarse frequency adjustment step using laser beam irradiation of the known art illustrated in FIG. 8.

In the laser-used coarse frequency adjustment step, the frequency adjustment metal films 19 and 20 are removed in a substantially equal amount to that in the known art.

The multiple tuning fork-type crystal vibration pieces 3 on the crystal wafer subsequent to the laser-used coarse frequency adjustment are broken off the crystal wafer into individual pieces. Each individual tuning fork-type crystal vibration piece 3 is housed in the package 2 after its metal bumps 8 are joined to the electrode pads 7 on the base 4, and then sealed in the package 2 with the lid member 5.

In the tuning fork-type crystal vibration piece of this embodiment, |fo1−fo2| is an absolute value of difference between the first target frequency fo1 in the electrode forming step and the second target frequency fo2 in the weighing step, |fo2−fo3| is an absolute value of difference between the second target frequency fo2 and the third target frequency in the coarse frequency adjustment step, and the ratio of |fo2−fo3| to |fo1−fo2| (|fo2−fo3|/|fo1−fo2|) is less than or equal to 0.5, i.e., (|fo2−fo3|/|fo1−fo2|)≤0.5.

In this embodiment, this ratio (|fo2−fo3|/|fo1−fo2|) may be, for example, approximately 0.4.

Thus, the ratio of the amount of frequency adjustment metal films 19 and 20 removed in the coarse frequency adjustment step to the amount of frequency adjustment metal films 19 and 20 formed at edges of the arm portions 11 and 12 in the weighting step may be reduced to a smaller value than in the known art.

As a result, the frequency adjustment metal film 19, 20 may be left unremoved in a length greater than half the length of the metal film along the longitudinal direction after the coarse frequency adjustment step.

In case the arm portions 11 and 12 of the tuning fork-type crystal vibration piece 3 are warped toward the lid member 5 under impact from outside, the remaining frequency adjustment metal films 19 and 20 are allowed to contact the inner surface of the lid member 5. This may avoid any contact of edges of the widened tip-side parts 11a and 12a in the arm portions 11 and 12 with the inner surface of the lid member 5 and accordingly prevent damage to or breakage of these edges possibly caused by the contact. As a result, impact-caused frequency fluctuations may be unlikely to occur.

In case the arm portions 11 and 12 of the tuning fork-type crystal vibration piece 3 are warped toward the base 4 under any impact from outside, the abutting portions 11b and 12b of the arm portions 11 and 12 may contact the cushioning portion 9 formed on the bottom surface of the base 4. This embodiment, however, may prevent such an undesirable event of the known art that the tip-of-arm electrodes chip off under the impact, causing frequency fluctuations.

In case the arm portions 11 and 12 of the tuning fork-type crystal vibration piece 3 are warped under impact from outside toward the lid member 5 on the opposite side of the base 4 where the cushioning portion 9 is formed, the frequency adjustment metal films 19 and 20 left unremoved are allowed to contact the inner surface of the lid member 5. This may avoid any contact of edges of the arm portions 11 and 12 with the inner surface of the lid member 5 and damage to or breakage of the edges possibly caused by the contact. As a result, impact-caused frequency fluctuations may be unlikely to occur.

The tuning fork-type crystal vibration piece 3 may successfully prevent frequency fluctuations possibly caused by the arm portions 11 and 12 being warped either toward the base 4 or toward the lid member 5. Thus, the tuning fork-type crystal vibration piece 3 obtained in this embodiment may excel in shock resistance.

Figure 9:
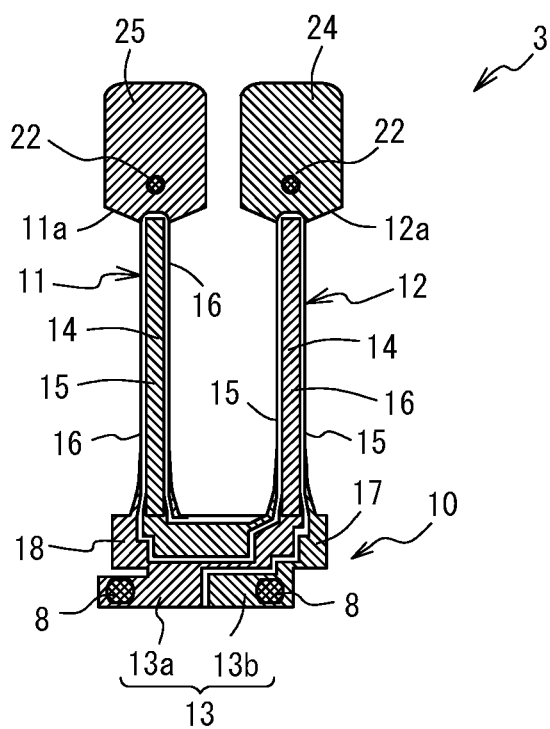
FIG. 9 is a drawing of another embodiment of the present invention illustrated correspondingly to FIG. 4.

This embodiment uses the laser beam for frequency adjustments, however, may use one selected from any other suitable beams but the laser beam, for example, ion beam Second Embodiment FIG. 9 is a drawing according to another embodiment of the present invention illustrated correspondingly to FIG. 4. Any structural elements that are similar to or the same as those described in the earlier embodiment will not be described again but are simply illustrated with the same reference signs.

The earlier embodiment provides the electrodeless regions 21 with no tip-of-arm electrode, which are the regions including at least the abutting portions 11b and 12b allowed to contact the cushioning portion 9 when the first and second arm portions 11 and 12 are warped toward the bottom surface of the base 4 under impact from outside.

In this embodiment, the tip-of-arm electrode 25, 24 is formed along the circumference of the tip-side part 11a, 12a of the first, second arm portion 11, 12 as in the known art.

Figure 10:
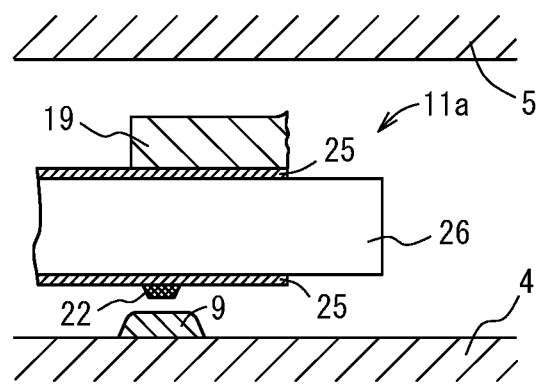
FIG. 10 is a schematic view in cross section of the embodiment of FIG. 9 illustrated correspondingly to FIG. 6.

In this embodiment, metal films 22; shock absorbers serving to absorb any shock generated at the time of contact, are formed on the main surfaces of the tip-side parts 11a and 12a of the first and second arm portions 11 and 12 facing the bottom surface of the base 4, as illustrated in schematic cross-sectional views of FIGS. 9 and 10. The metal films 22 are formed in regions that allow them to contact the cushioning portion 9 when the first and second arm portions 11 and 12 are warped toward the bottom surface of the base 4 under impact from outside.

To effectively absorb the impact-caused shock, the metal films 22 may be each formed in a thickness of 1 µm or more, for example, 10 µm in this embodiment. The metal film 22 is made of a metal, like the metal bump 8 described earlier, and is formed by plating, for example, electrolytic plating. The metal films 22 may be formed at the same time as the metal bumps 8.

The metal films 22 are formed in regions that allow them to contact the cushioning portion 9 when the first and second arm portions 11 and 12 are warped toward the bottom surface of the base 4 under impact from outside. In this embodiment, the metal films 22 are formed on the widened tip-side parts 11*a* and 12*a* of the first and second arm portions 11 and 12, specifically, at positions on these parts 11*a* and 12*a* at the center in the width direction and closer to the stem portion 10. The metal films 22 have a substantially circular shape in plan view.

The metal films 22 that absorb any shock generated at the time of contact with the cushioning portion 9 are formed by plating in a thickness of 1 µm or more in the regions of the first and second arm portions 11 and 12 that allow the metal films 22 to contact the cushioning portion 9 formed on the bottom surface of the base 4. In case the tuning fork-type crystal vibration piece 3 warps under impact from outside, causing the metal films 22 on the arm portions 11 and 12 to contact the cushioning portion 9 on the bottom surface of the base 4, the metal films 22 may be unlikely to peel off and may absorb well any shock generated at the time of contact. This may eliminate the risk of tip-of-arm electrodes being chipped off and may prevent frequency increases to higher frequencies when any impact from outside is applied to the crystal vibration piece. As illustrated in the schematic cross-sectional view of FIG. 10, the metal films 22 on the other main-surface side of the crystal vibration piece 3 are formed in the abutting portions away from the edges of the arm portions. Therefore, the metal films 22 formed in these regions may be left intact during the laser beam irradiation to partly remove the frequency adjustment metal films 19 and 20 at the edges of the arm portions. Thus, the metal films 22 may adequately absorb any shock at the time of contact between the cushioning portion and the crystal vibration piece 3, and the remaining frequency adjustment metal films 19 and 20 may prevent possible contact between the inner surface of the lid member and the edges of the arm portions.

Figure 11A:
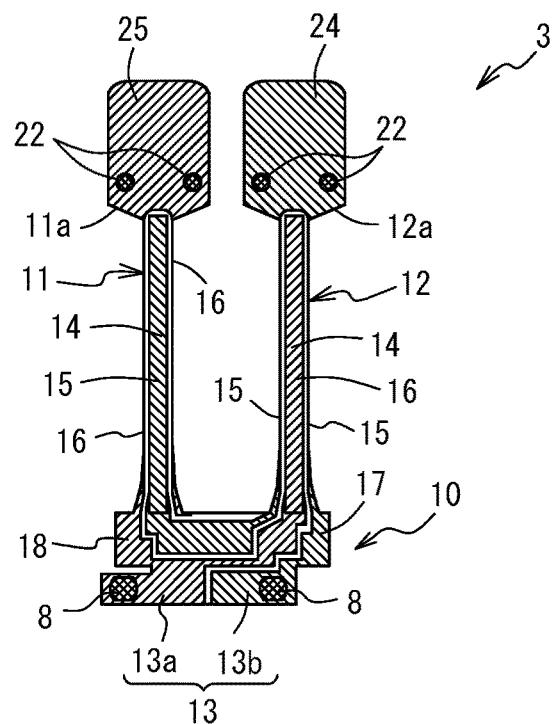
FIG. 11A is a drawing of yet another embodiment of the present invention.

The metal films 22; shock absorbers, each formed at one position of the arm portion in this embodiment may be formed at more than one, for example, two positions, as illustrated in FIG. 11A.

Figure 11B:
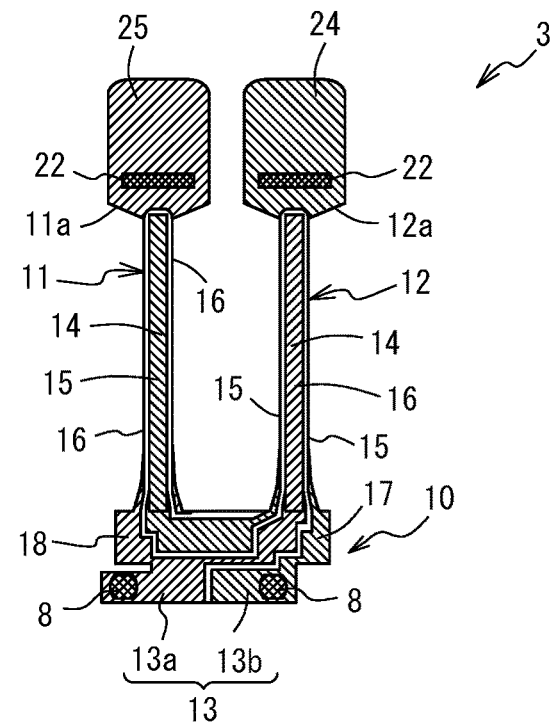
FIG. 11B is a drawing of yet another embodiment of the present invention.

The metal film 22 circular in plan view may be formed otherwise, for example, may be formed in a rectangular shape in plan view along the width direction of the tip-side part 11*a*, 12*a* of the arm portion 11, 12, as illustrated in FIG. 11B.

In this embodiment, the tip-of-arm electrodes 24 and 25 are provided where the metal films 22; shock absorbers, are formed. In other embodiments of the present invention, a region of the metal film 22 including its surrounding area may be an electrodeless region where the raw surface of crystal is exposed in the absence of any tip-of-arm electrodes.

Figure 12:
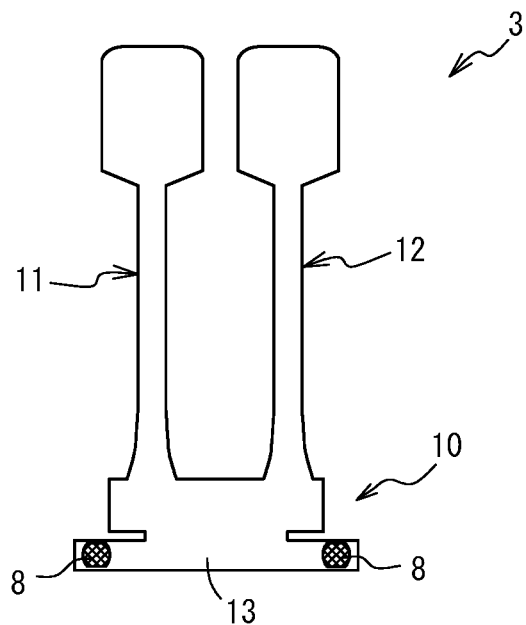
FIG. 12 is a drawing that illustrates the outer shape of a tuning fork-type crystal vibration piece according to yet another embodiment of the present invention.
Figure 13:
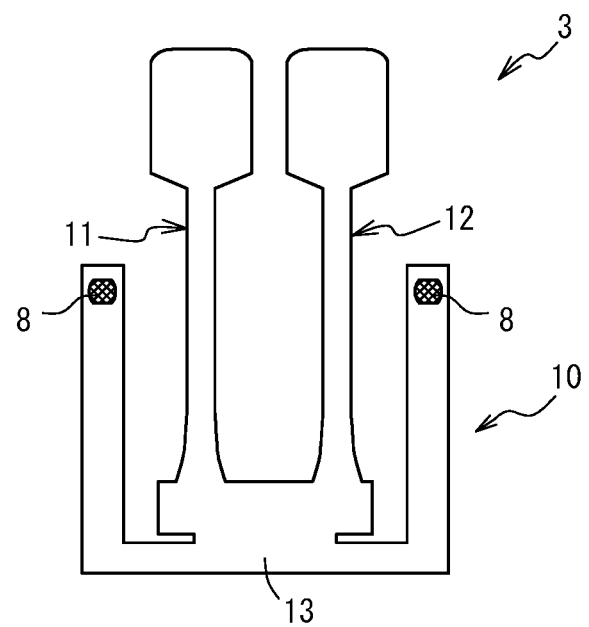
FIG. 13 is a drawing that illustrates the outer shape of a tuning fork-type crystal vibration piece according to yet another embodiment of the present invention.
Figure 14:
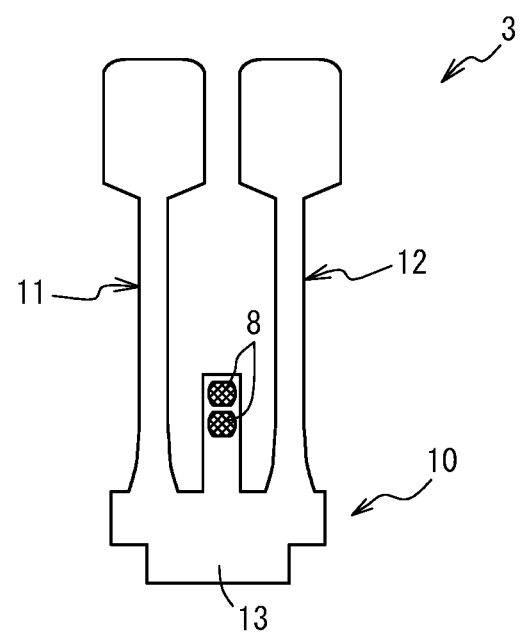
FIG. 14 is a drawing that illustrates the outer shape of a tuning fork-type crystal vibration piece according to yet another embodiment of the present invention.

In the embodiments described thus far, the joining portion 13 constituting part of the stem portion 10 extends in a direction opposite to the extending direction of the first, second arm portion 11, 12 and then in a direction orthogonal to the extending direction (rightward in FIG. 3). The joining portion 13 may have a laterally symmetrical shape, lateral ends of which extend in two directions included in the orthogonal direction (leftward and rightward in FIG. 12), as is known from the outer shape of the crystal vibration piece 3 illustrated in FIG. 12. As illustrated in FIG. 13, the joining portion 13 may have a laterally symmetrical shape, lateral ends of which extend in two directions included in the orthogonal direction (leftward and rightward in FIG. 13) and further extend parallel to the extending direction of the first, second arm portion 11, 12. As illustrated in FIG. 14, the joining portion 13 may extend from between the first and second arm portions 11 and 12 along the extending direction of these arm portions. In the crystal vibration piece 3 in which the joining portion 13 is shaped as described so far, two metal bumps 8 to be joined to the electrode pads 7 of the base 4 are located at an end(s) of the extending joining portion 13, as illustrated in FIGS. 12 to 14. The joining portion 13 may or may not have a portion(s) formed along the extending direction or a direction(s) orthogonal to the extending direction.

In the embodiments described thus far, the present invention is applied to the tuning fork-type crystal vibration piece. The present invention may also be applicable to any other suitable piezoelectric materials but crystal.

REFERENCE SIGNS LIST

1 tuning fork-type crystal vibrator
2 package
3 tuning fork-type crystal vibration piece
4 base
5 lid member
7 electrode pad
8 metal bump
9 cushioning portion
10 stem portion
11 first arm portion
12 second arm portion
13 joining portion
15 first driving electrode
16 second driving electrode
17, 18 extraction electrode
19, 20 frequency adjustment metal film
21 electrodeless region
22 metal film (shock absorber)
24, 25 tip-of-arm electrode
26 crystal

The invention claimed is:

1. A tuning fork-type vibrator, comprising:
a tuning fork-type vibration piece that comprises a stem portion and a plurality of arm portions extending from the stem portion; and
a package including a housing portion in which the tuning fork-type vibration piece is housed,
wherein
the stem portion is joined to an electrode in the housing portion of the package,
wherein
the housing portion of the package has a cushioning portion formed in a certain thickness on a bottom surface thereof,
wherein
the cushioning portion is formed to avoid contact of edges of the plurality of arm portions with the bottom surface by allowing abutting potions of the plurality of arm portions to contact the cushioning portion in case the plurality of arm portions on a free end side of the tuning fork-type vibration piece are warped toward the bottom surface, the abutting portions being any parts but the edges of plurality of arm portions,
wherein
a frequency adjustment metal film is formed in an edge-side region on one of front and back main surfaces in a respective one of the plurality of arm portions,
wherein
the abutting portions are electrodeless regions where the tuning fork-type vibration piece has a raw surface thereof exposed in the absence of any electrode
and wherein the electrodeless region is formed in an edge-side region on the other one of the front and back main surfaces in the respective one of the plurality of arm portions.

2. The tuning fork-type vibrator according to claim 1, wherein
the edge-side regions of the plurality of arm portions provided with the frequency adjustment metal films are greater in width than any other regions of the plurality of arm portions.

3. The tuning fork-type vibrator according to claim 2, wherein
in the tuning fork-type vibration piece supported in the package in a cantilever fashion, the cushioning portion is formed on the bottom surface so as to extend in a direction orthogonal to a direction of extension of the plurality of arm portions correspondingly to the tip-side regions increased in width of the plurality of arm portions.

4. A tuning fork-type vibrator, comprising
a tuning fork-type vibration piece having a stem portion and a plurality of arm portions extending from the stem portion; and
a package including a housing portion in which the tuning fork-type vibration piece is housed,
wherein
the stem portion is joined to an electrode in the housing portion of the package,
wherein
the housing portion of the package has a cushioning portion formed in a certain thickness on a bottom surface thereof,
wherein
the cushioning portion is formed to avoid contact of edges of the plurality of arm portions with the bottom surface by allowing abutting portions of the plurality of arm portions to contact the cushioning portion in case the plurality of arm portions on a free end side of the tuning fork-type vibration piece are warped toward the bottom surface, the abutting portions being any parts but the edges of plurality of arm portions,
and wherein
the abutting portions each comprise a shock absorber that absorbs shock at the time of contact with the cushioning portion.

5. The tuning fork-type vibrator according to claim 4, wherein
the shock absorbers each include a metal film.

6. The tuning fork-type vibrator according to claim 5, wherein
the metal films have a thickness greater than or equal to 1 μm.

7. The tuning fork-type vibrator according to claim 5 or 6, wherein
the stem portion comprises a metal bump formed to join the tuning fork-type vibration piece to the electrode in the housing portion of the package, and
the metal bump includes a material used to for the metal film.

* * * * *